United States Patent
Nayak et al.

(10) Patent No.: US 7,852,097 B2
(45) Date of Patent: Dec. 14, 2010

(54) METHODS AND APPARATUSES FOR IMPROVED POSITIONING IN A PROBING SYSTEM

(76) Inventors: Uday Nayak, 3319 Pinkerton Ct., San Jose, CA (US) 95148; Xiaolan Zhang, Block 607, #11-188, Zilas Road, Singapore (SG) 510607; George Asmerom, 3113 Ledoux Ct., San Jose, CA (US) 95135; Max Jedda, 879 Pippin Ave., Sunnyvale, CA (US) 94087

( * ) Notice: Subject to any disclaimer, the term of this patent is extended or adjusted under 35 U.S.C. 154(b) by 331 days.

(21) Appl. No.: 12/042,294

(22) Filed: Mar. 4, 2008

(65) Prior Publication Data
US 2008/0150565 A1   Jun. 26, 2008

Related U.S. Application Data

(62) Division of application No. 11/335,367, filed on Jan. 18, 2006, now Pat. No. 7,368,929.

(51) Int. Cl.
   *G01R 31/02* (2006.01)
(52) U.S. Cl. .................................................. 324/758
(58) Field of Classification Search ............... 324/754, 324/760, 761–762, 756–758, 158.1; 250/306, 250/307, 310–311; 257/48; 438/14–18
   See application file for complete search history.

(56) References Cited

U.S. PATENT DOCUMENTS

| | | | |
|---|---|---|---|
| 5,517,128 A | 5/1996 | Henninger | |
| 6,384,734 B1 * | 5/2002 | Ohno et al. | 340/679 |
| 6,777,968 B1 | 8/2004 | Kobayashi et al. | |
| 7,119,566 B2 * | 10/2006 | Kim | 324/758 |
| 2001/0054892 A1 | 12/2001 | Takekoshi | |
| 2002/0080041 A1 | 6/2002 | Ohno et al. | |
| 2004/0062104 A1 | 4/2004 | Muller et al. | |
| 2004/0100297 A1 | 5/2004 | Tanioka et al. | |
| 2005/0083073 A1 | 4/2005 | Nihei et al. | |

FOREIGN PATENT DOCUMENTS

EP   1 258 733 A1   11/2002

OTHER PUBLICATIONS

PCT Notification Concerning Transmittal of International Preliminary Report on Patentability (Chapter 1 of the Patent Cooperation Treaty), International Application No. PCT/US2006/042478 mailed Jul. 31, 2008, total 10 pages.
PCT Notification of Transmittal of International Search Report and Written Opinion of the International Searching Authority, or the Declaration, mailed May 31, 2007, total 14 pages.

* cited by examiner

*Primary Examiner*—Ha Tran T Nguyen
*Assistant Examiner*—Tung X Nguyen
(74) *Attorney, Agent, or Firm*—James C. Scheller, Jr.

(57) ABSTRACT

An improved method and apparatus for automatically and accurately aligning a wafer prober to the bonding pads of a semiconductor device are provided. In one embodiment of one aspect of the invention, a multi-loop feedback control system incorporating information from a number of sensors is used to maintain the desired contact position in the presence of disturbances. Other aspects and other embodiments are also described.

2 Claims, 5 Drawing Sheets ered in the wafer probing process. In response, major vendors of wafer probers have offered some form of automatic probe to pad alignment. However, the existing forms of automatic alignment are often not sufficient to provide accurate alignment for modern integrated circuits that have very small and imperfectly shaped pads and probe tips and to ensure the maintenance of accurate relative positioning and contact in the presence of disturbances.

METHODS AND APPARATUSES FOR IMPROVED POSITIONING IN A PROBING SYSTEM

RELATED APPLICATIONS

This application is a divisional of U.S. patent application Ser. No. 11/335,367, filed Jan. 18, 2006, now U.S. Pat. No. 7,368,929 entitled "Methods and Apparatuses for Improved Positioning in A Probing System" which is hereby incorporated herein by reference in its entirety.

FIELD OF THE INVENTION

This invention relates to systems for probing devices having a plurality of locations designed to make electrical contact with targets such as semiconductor devices. More particularly, this invention relates to methods and apparatuses to accurately achieve and maintain the positioning of a probe card relative to the bonding pads of an integrated circuit device.

BACKGROUND OF THE INVENTION

Integrated circuits are often manufactured on a semiconductor substrate, such as a silicon wafer. The silicon wafer is typically a thin circular plate of silicon that is 150 or 200 or 300 millimeters in diameter and approximately 0.64 millimeters thick. Typically, a single wafer will have numerous devices which are integrated circuits formed on a lattice pattern. Each device consists of numerous layers of circuitry and a collection of external bonding pads. The bonding pads are small sites, typically 3 mils square, made usually with aluminum that eventually serve as the device's connections to the pin leads. The aluminum itself forms a thin non-conductive layer of aluminum oxide, which must be eliminated or broken through before good electrical contact can be made.

Since the packaging of a device is a costly procedure, it is desirable to test a device beforehand to avoid packaging faulty devices. The testing process involves establishing electrical contact between a device called a probe card and the wafer and then running a series of tests on the devices on the wafer's surface. The probe card has a collection of electrical contact pins that stand in for the normal pins and wire leads of a packaged device. The wafer is positioned relative to the probe card so that the contact pins on the probe card make contact with a wafer's bonding pads and a special tester runs a battery of electrical tests on the wafer's devices. A special machine, called a wafer prober, is used to position the wafer with respect to the probe card.

A wafer prober might be considered a three dimensional positioner. The primary purpose of wafer probing is to accurately position the wafer relative to the probe card in a manner that ensures that the wafer device's bonding pads make good electrical contact with a probe card's probe tips in order to properly test a device before dicing and packaging. High accuracy is required, because the devices' bonding pads on the wafer present a very small contact footprint and if a probe card pin were to make contact outside the bonding pad area, the result may be a break in the wafer's external surface layer, which generally results in a damaged device.

Of the three main processes required for good probing—wafer alignment, thickness profiling, and probe to pad alignment—only probe to pad alignment has not traditionally been automated. However, recent developments in semiconductor technology have driven a requirement for automation. In an effort to improve performance and to include more features on each device, sensitive components are being fabricated under the bond pads. Accurate positioning of the wafer substrate under the pins also enables shrinking of the pad size thereby allowing more room for the active circuitry. Accuracy and throughput issues have therefore led to the development of the automatic wafer prober.

There are several different considerations involved in wafer probing. Due to the thin layer of nonconductive oxide residue that forms over the bonding pad during normal atmospheric exposure, the probe tips must penetrate the residue and travel vertically beyond initial contact in order to make contact with the aluminum underneath. For instance, in the most common form of probe card technology, cantilever probes, a portion of this vertical over travel is transformed into motion along the plane of the wafer, or scrub, to further guarantee that the tip is in good contact with the underlying aluminum. In addition, the devices (with the exception of the bonding pads) are coated with an insulating layer of glass. If this glass layer is breached by the probe tips, the resultant cracks may damage an otherwise functional device. Therefore, a critical component of pad to probe alignment is the maintaining of an optimal relative (or contact) position between the probe card pins and the wafer pads. An optimal contact position is necessary to ensure that the exact required amount of contact pressure is exerted between the pins and a pad being tested. If too little pressure is exerted, insufficient contact is achieved and the prober cannot properly test because it may fail to break through the external oxide residue. If, on the other hand, too much pressure is exerted, damage to the pads may occur. Consequently, accurate positioning specifically along the contact load axes is a requirement for proper testing.

A further consideration for the maintenance of accurate contact positioning relates to the proper compensation of disturbances during operation. For instance, as the testing system runs the temperature of the system will be expected to change, and may do so at different levels for the different components making up the testing assembly. Temperature variations lead to relative expansion or contraction of the various components making up the system and in effect may change the previous relative (or contact) position between the pins and the pads. A disturbance in relative position can in turn lead to a change in the desired or commanded contact pressure between the pins and pad, which is of critical importance in maintaining proper performance.

However, prior art wafer prober systems do not provide thermal disturbance compensation. Current designs incorporate a drive and measurement mechanism situated at an appreciable distance from the wafer substrate locating surface. This method does not accurately and actively control the substrate surface during probing, especially at non-ambient temperatures.

In summary, recent advances in semiconductor technology have established a need for automatic probe to pad alignment during the testing process. In response, major vendors of wafer probers have offered some form of automatic probe to pad alignment. However, the existing forms of automatic alignment are often not sufficient to provide accurate alignment for modern integrated circuits that have very small and imperfectly shaped pads and probe tips and to ensure the maintenance of accurate relative positioning and contact in the presence of disturbances.

SUMMARY OF THE DESCRIPTION

Improved methods and apparatuses are provided for automatically and accurately positioning a plurality of pads of an integrated circuit device for contact with a plurality of contact electrodes (e.g. pins on a probe card in a wafer prober). According to one embodiment of an aspect of the invention, a plurality of position and/or force sensors and/or velocity sensors are integrated into a multi-loop motion feedback control system in order to accurately measure and control the position of a substrate (wafer) locating surface relative to a probe card. The control system uses the sensor information to compensate for position changes due to the effects of load bearing between the prober and wafer pads and of temperature changes during operation.

According to another embodiment of another aspect of the invention, a thermally compensating sensor mount is employed to isolate the effects of temperature changes on sensor readings. An example of such a mount is a mount fabricated from athermal materials which have minimal changes in size due to changes in temperature.

A further embodiment of the invention includes using actuators in the wafer alignment mechanism to compensate for tilt on the locating surface introduced by the load bearing between the probe card and wafer assemblies.

These and other embodiments, features, aspects, and advantages of the present invention will be apparent from the accompanying drawings and from the detailed description and appended claims which follow.

The methods described herein can be performed by a data processing system, such as a general purpose computer, performing under software control where the software can be sorted in a variety of readable media.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Methods and apparatuses for accurately achieving and maintaining a desired contact position between a probe and pad in a testing system are disclosed. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention.

Figure 1:
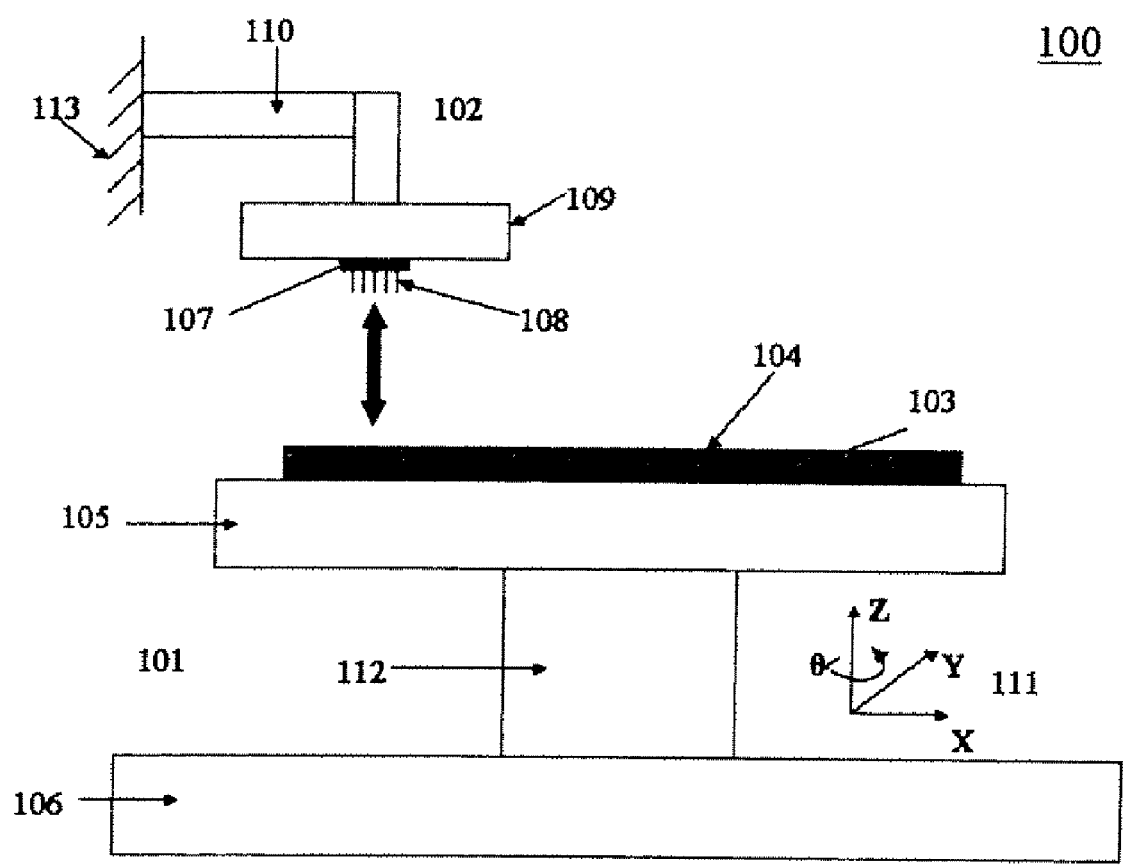
FIG. 1 illustrates an embodiment of a prober testing system.

Probing involves contacting the pad surface of the wafer with probe tips such that the tips "scrub" or slide across the bond pads under high pressure conditions and make electrical (resistive) contact with the pads on one or more ICs (integrated circuits) on the wafer. In one possible embodiment of the present invention, the prober system consists of two main components, or stages, one holding the wafer and the other the probe card. The two stages move relative to one another and are brought together in order to create the high pressure contact between the pads and tips. FIG. 1 shows a schematic of one such possible embodiment of a probing system 100, consisting of two main stages 101 and 102. The two stages are termed the Wafer holder Assembly (WHA) stage 101 and the Probe-card Holder Assembly (PHA) 102.

The WHA stage 101 consists of a wafer chuck 105 used for securing the wafer 103, on which die contact pads 104 are formed; a motion mechanism 106 capable of moving the chuck and wafer along the X and Y directions 111; and a vertical or Z stage 112 capable of causing linear and rotary displacement of the chuck and wafer along the Z axis 111.

The PHA stage 102 consists of a probe chuck 109 to hold and secure a probe card 107 whose contact pins 108 are designed to pierce through the outer oxide layer of the wafer's bonding pads 104 during contact operations; and a stationary base 110 supporting the chuck to an attachment point 113.

Figure 2:
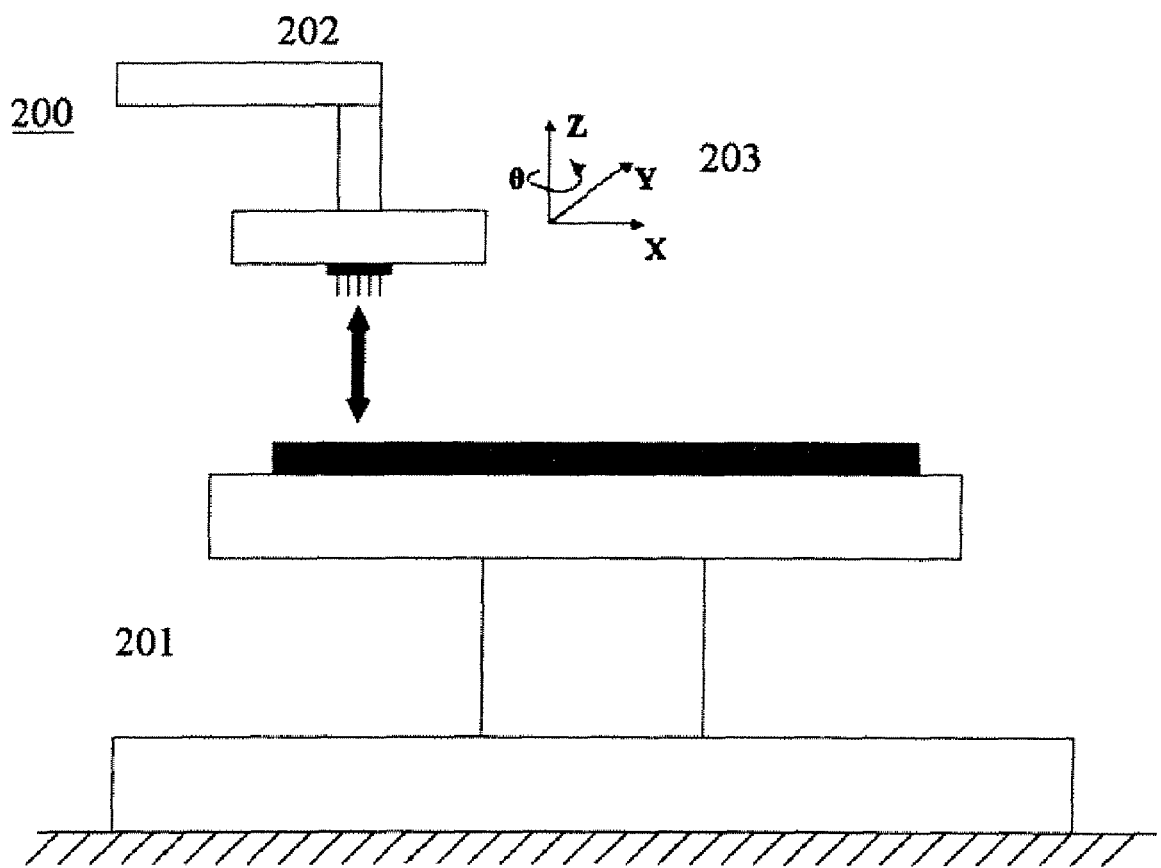
FIG. 2 illustrates an alternative embodiment of a prober testing system.

In the embodiment shown in FIG. 1, the PHA stage remains stationary while the WHA stage is actuated in the X,Y and Z linear directions as well as around the Z axis in a rotational direction (termed θ) 111. This multi-degree of freedom actuation allows for the relative motion between the WHA and PHA stages necessary to achieve contact between the probe card pins and wafer pads. In other possible embodiments, the WHA stage or both stages can be actuated (e.g. moved in one or more degrees of freedom) to achieve contact. FIG. 2 shows an alternative embodiment of a testing system 200 where the WHA stage 201 is stationary and the PHA stage 202 is actuated in the X,Y,Z and theta directions.

One aspect of embodiments of the invention incorporates the use of sensors to measure the probe to pad contact position continuously during operation of the testing system. In another aspect of the invention the information gathered by the sensors is input in a feedback control system and compared with the desired, or target, contact position. If the position measured by the sensors differs from the desired contact position, the control system will calculate the required corrective action, which is implemented via motion actuators in the WHA or PHA stages.

Figure 3:
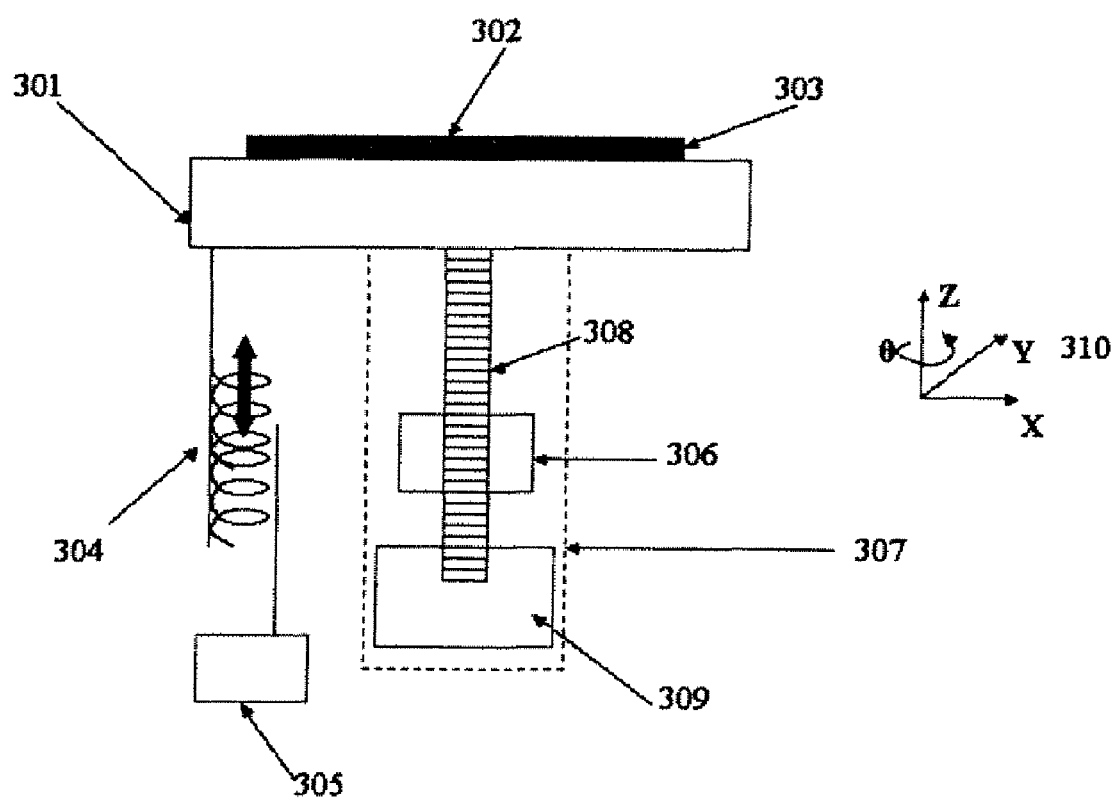
FIG. 3 illustrates an embodiment of position and velocity sensing in a prober testing system.

FIG. 3 shows a schematic of a possible embodiment of a WHA stage comprising two sensors: in the particular embodiment shown in FIG. 3, the first sensor 304 is a high-resolution linear encoder coupled to the wafer chuck 301 and mounted mechanically on an athermal mount 305 which is fabricated from an athermal material, such as invar, which is a well-known nickel and iron alloy having a very low coefficient of thermal expansion (CET). The second sensor shown in FIG. 3 is a lower-resolution rotary encoder 306 attached to the lead screw 308 of the motor 309 actuating the Z stage 307 along the vertical or Z direction.

In the particular embodiment shown in FIG. 3 the linear encoder is used to measure the vertical position or displacement (along the Z axis 310) of the wafer chuck 301. The high resolution provided by a linear encoder allows for accurate measurements of the wafer chuck's vertical position and the athermal mount 305 tends to minimize measurement errors due to changes in temperature. Certain forms of invar have a mean CET (coefficient of thermal expansion) of approximately less than $1.3 \times 10^{-6}$ per °C. in the range of 20° C.-100° C. Some forms of invar (and other types of athermal materials) have a mean CTE in a range of approximately $0.63 \times 10^{-6}$ per °C. to $1.6 \times 10^{-6}$ per °C. Illustrating another aspect of the present invention, the linear encoder position sensor is mounted externally using a thermally compensating mechanical mount 304, as illustrated in FIG. 3, which could be made of an athermal material such as invar. During operation of the testing system the temperature of the various components making up the system is likely to rise and fluctuate. In order to avoid any relative contraction or expansion between the sensor and the target component it is designed to track (the wafer chuck 301 in the example of FIG. 3) it is important to thermally isolate the sensor from any components other than the target component. Mounting the sensor on an athermal mount will accomplish this objective, and any other possible embodiments resulting in the previously described thermal isolation of the position sensor are also covered by the present invention.

Figure 4:
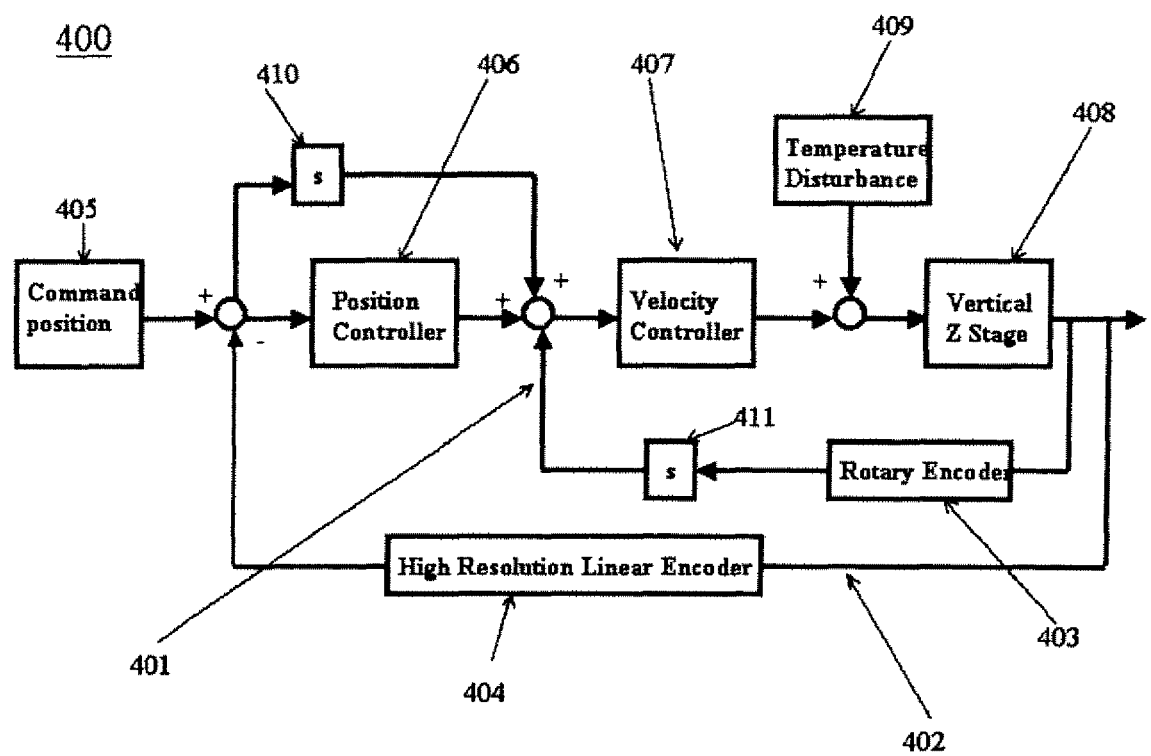
FIG. 4 illustrates a block diagram of a dual-loop feedback control scheme.

In the embodiment shown in FIG. 3, the lower-resolution rotary encoder 306 can be used to measure the vertical velocity of the Z stage 307, and by inference, of the wafer chuck 301 and wafer 302. The velocity readings from the rotary encoder can be incorporated into a feedback motion control mechanism along with the position reading from the primary position sensor (the linear encoder 304), in order to result in the accurate tracking of the desired contact position between the wafer pads and probe pins. A possible feedback control system is illustrated in FIG. 4. In a further an alternative embodiment the rotary encoder can be used as a means to crudely measure the vertical position, although the accuracy will be limited by its low resolution and lack of thermal isolation.

FIG. 3 illustrates only one possible embodiment of a WHA stage incorporating sensing which may use dual sensors to measure changes in position and/or velocity in at least one degree of freedom. In other possible embodiments, a different combination and number of linear and rotary encoders or other position and velocity sensors could be employed and coupled to either or both of the WHA and PHA stages.

FIG. 4 shows a block diagram of a possible embodiment of a control system incorporating information from a position sensor 404 and velocity sensor 403 to maintain the desired vertical position 405 of a Z stage 408. An embodiment of this control system shown in FIG. 4 may be used to control movement in the Z axis for the embodiment of FIG. 3, in which the sensor 304 corresponds to position sensor 404 and the encoder 306 corresponds to velocity sensor 403. The control mechanism is configured to make use of both sensors 403 and 404 in a dual-loop mode, where the velocity sensor 403 is used in a velocity feedback loop 401 portion of the control and the position sensor 404 is used in the position feedback loop 402 portion of the control scheme. The velocity loop 401 uses a control algorithm (such as a traditional position determination control algorithm) embodied in a velocity controller 407 that takes as input the desired velocity of the Z stage (obtained by differentiating 410 the desired position 405), the reading from the rotary sensor 403 (duly differentiated 411 to produce a velocity reading) and the control signal output by the position controller 406. Changes in temperature during operation are embodied as a temperature disturbance 409 added to the stage 408 (the vertical Z stage). The computed output of the velocity controller (a set of forces, exerted via actuators) then acts on the stage 408 to control its velocity to the desired value. Similarly, the position loop 402 uses its own control algorithm as embodied by the position controller 406 to compute a control signal (another set of forces) that acts to maintain the desired Z position 405 of the Z stage 408, taking as input the desired, or commanded, vertical position 405 and the readings of the linear encoder position sensor 403.

In one possible embodiment the control output and input information in the two loops are verified and compensated for every 50 microseconds. Such a method would allow increasingly accurate and continuous monitoring and control of the substrate locating surface (wafer chuck) position at all temperatures. Other embodiments of control systems incorporating the readings of multiple sensors in order to achieve the accurate and continuous positioning of wafer pads relative to probe pins in any direction and in the presence of disturbances are also covered by the present invention.

Figure 5:
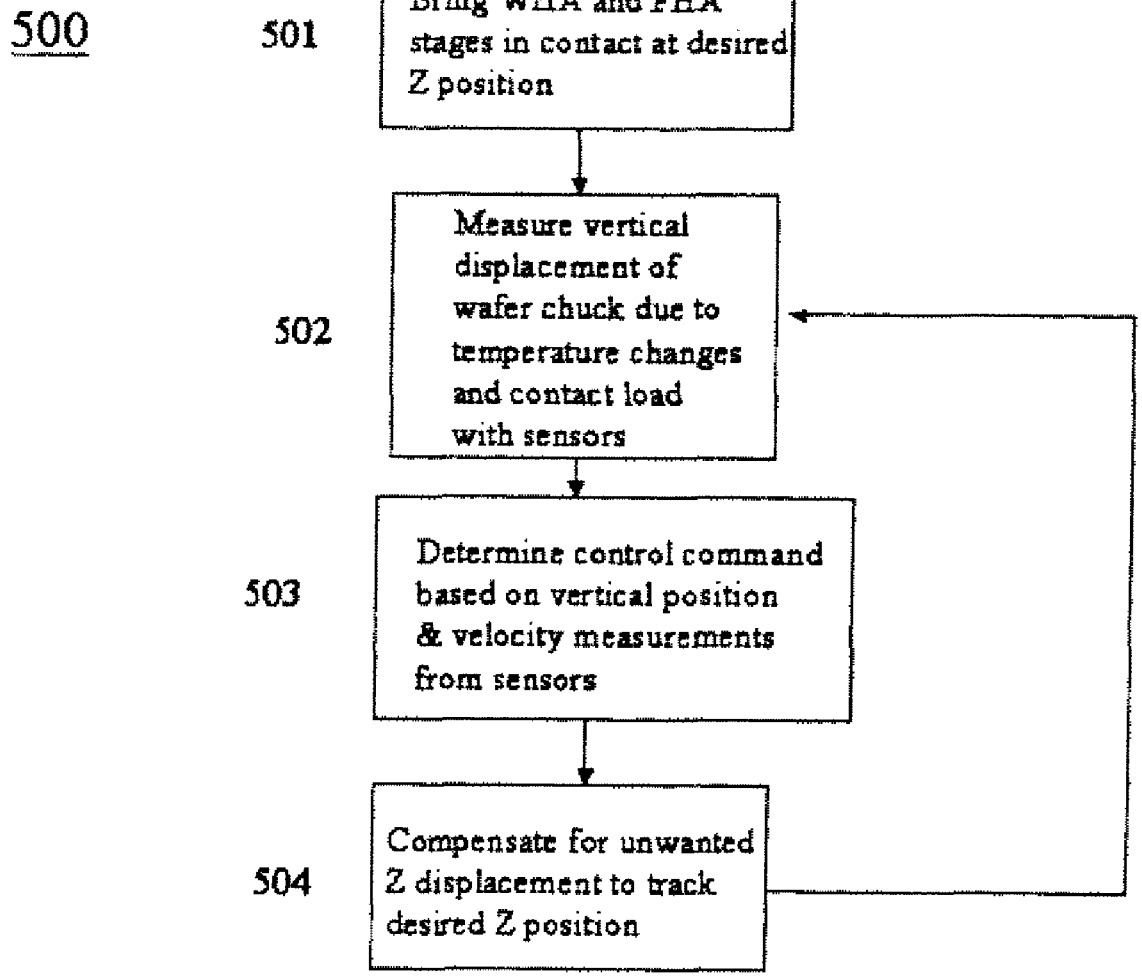
FIG. 5 illustrates a flow diagram showing the operations of a testing system that accurately maintains the desired relative contact position by incorporating thermal disturbance compensation via sensing.

FIG. 5 is a flow diagram showing a possible embodiment of the steps involved in a testing system making use of sensors and a control system to regulate the vertical position of the WHA stage. As a first step 501, the WHA and PHA stages are brought in contact until the desired contact position and force is achieved. In order to maintain that desired contact position, the position and velocity of the wafer chuck is first measured 502 to detect changes in the position due to disturbances such as temperature changes or applied loads. A control system then determines the required corrective action based on the sensor information 503. The corrective forces are then applied to the wafer chuck via actuators incorporated in the WHA stage to eliminate any unwanted Z position disturbances and to track the desired Z position 504. Steps 502-504 are continually repeated (for example every 50 milliseconds) to ensure that any disturbances to the desired position are promptly corrected. Other embodiments where other parameters and components of the system are monitored and controlled are also possible.

Proper probing action requires the application of strong pressure and a high amount of friction between a wafer pad being tested and the probe card pins to ensure the pins break through the outer oxide layer. During testing of a given wafer pad, the pressure is only exerted on the footprint of the pad, and not on the rest of the wafer surface. This highly localized large pressure force in effect results in a rotational torque being applied to the wafer and its holding chuck. The magnitude of the torque varies with the location of the pressure application point but, if sufficiently large, can result in a tilting of the WHA stage or some of its components. In an embodiment of another aspect of the present invention, actuators placed around the periphery of the wafer chuck can be used to compensate for tilt (along both the X and Y axes) when a contact load is applied. Existing or additional sensors can detect any angular displacement about the X or Y axes and feed the information to a simple controller that in turn generates a properly calibrated command signal to the actuators, thereby eliminating any tilt.

The methods described herein can be performed by a data processing system, such as a general or special purpose computer, performing under software control where the software can be sorted in a variety of readable media.

The various embodiments of the inventions may be used on wafer probers having wafer chucks which hold full wafers or other types of probing systems such as systems which probe die or dice on film frames (which are flexible) or strips (which may be rigid).

At least certain embodiments of this invention may utilize one or more methods and/or systems described in co-pending U.S. patent application Ser. No. 11/271,416 filed on Nov. 9, 2005 and entitled "Method for Probing Impact Sensitive and Thin Layered Substrate," which application is hereby incorporated herein by reference.

Thus, apparatuses and methods have been provided for achieving and maintaining the accurate pad to probe contact positioning in a testing system in the presence of disturbances. Although the present invention has been described with reference to specific exemplary embodiments it will be evident that various modifications and changes may be made to these embodiments without departing from the broader spirit and scope of the invention as set forth in the claims.

Accordingly the specification and drawings are to be regarded in an illustrative rather than a restrictive manner.

What is claimed is:

1. A testing system operable to accurately maintain a relative position between a plurality of contact electrodes and a plurality of electrical contacts, the testing system comprising:
   a first sensor coupled to a first component, the first component configured to hold a device coupled to the plurality of electrical contacts, wherein the first sensor is configured to measure a first parameter along an axis of a three-dimensional coordinate system and wherein the first sensor is coupled to an athermal mount;
   a second sensor coupled to the first component, the second sensor configured to measure a second parameter along the axis;
   a control system coupled to the first component configured to receive information from the first sensor and from the second sensor and configured to determine actuation forces based on the information and wherein the actuation forces act on the first component to maintain a desired relative position between the contact electrodes and the electrical contacts; and
   a plurality of actuators coupled to the first component configured to exert the actuation forces determined by the control system and to eliminate a tilting of the first component caused by contact forces between the contact electrodes and the electrical contacts.

2. A testing system operable to accurately maintain a relative position between a plurality of contact electrodes and a plurality of electrical contacts, the testing system comprising:
   a first component configured to hold a first device coupled to the plurality of electrical contacts;
   a second component configured to hold a second device coupled to the plurality of contact electrodes and wherein the second component is configured to come in contact with the first component at high pressure;
   a control system coupled to the first component and coupled to a plurality of sensors, wherein the sensors are configured to measure a tilt in the first component; and
   a plurality of actuators coupled to the first component and to the control system and configured to receive a command from the control system and to apply forces to the first component to eliminate the tilt.

* * * * *